(12) United States Patent
Wang et al.

(10) Patent No.: US 10,739,412 B2
(45) Date of Patent: Aug. 11, 2020

(54) APPARATUS FOR DETERMINATION OF A GROUND FAULT AND ASSOCIATED METHOD

(71) Applicant: General Electric Technology GmbH, Baden (CH)

(72) Inventors: Zheng Wang, Shanghai (CN); Yongyue Ma, Shanghai (CN); Hengxu Ha, Stafford (GB)

(73) Assignee: General Electric Technology GmbH, Baden (CH)

( * ) Notice: Subject to any disclaimer, the term of this patent is extended or adjusted under 35 U.S.C. 154(b) by 164 days.

(21) Appl. No.: 15/999,415

(22) PCT Filed: Feb. 14, 2017

(86) PCT No.: PCT/EP2017/053322
§ 371 (c)(1),
(2) Date: Aug. 20, 2018

(87) PCT Pub. No.: WO2017/140691
PCT Pub. Date: Aug. 24, 2017

(65) Prior Publication Data
US 2019/0146021 A1    May 16, 2019

(30) Foreign Application Priority Data

Feb. 19, 2016 (EP) ..................... 16275030

(51) Int. Cl.
| | |
|---|---|
| G01R 31/08 | (2020.01) |
| G01R 31/52 | (2020.01) |
| G01R 19/04 | (2006.01) |
| H02H 1/04 | (2006.01) |
| G01R 31/50 | (2020.01) |
| H02H 7/28 | (2006.01) |
| H02H 3/16 | (2006.01) |
| G01R 19/02 | (2006.01) |
| H02H 1/00 | (2006.01) |
| H02H 7/26 | (2006.01) |

(52) U.S. Cl.
CPC ............. *G01R 31/50* (2020.01); *G01R 19/02* (2013.01); *G01R 31/086* (2013.01); *H02H 1/0007* (2013.01); *H02H 3/165* (2013.01); *H02H 7/28* (2013.01); *H02H 1/0092* (2013.01); *H02H 7/26* (2013.01); *Y04S 10/522* (2013.01)

(58) Field of Classification Search
CPC ........ G01R 31/02; G01R 31/08; G01R 31/50; G01R 31/52; G01R 19/02; G01R 19/04; H02H 1/00; H02H 1/04
See application file for complete search history.

(56) References Cited

FOREIGN PATENT DOCUMENTS

EP    2733498 A2 *    5/2014    ........... G01R 31/086

* cited by examiner

*Primary Examiner* — Neel D Shah
(74) *Attorney, Agent, or Firm* — Eversheds Sutherland (US) LLP (57) ABSTRACT

An apparatus for determining a phase associated with a ground fault on a multi-phase power distribution network, the apparatus configured to, based on determination of a spike fault, determine which of a plurality of RMS values of phase-to-phase fault currents is the minimum, said minimum RMS value indicative of a particular phase of the multi-phase power distribution network associated with the ground fault.

15 Claims, 4 Drawing Sheets

APPARATUS FOR DETERMINATION OF A GROUND FAULT AND ASSOCIATED METHOD

FIELD OF INVENTION

This invention relates to an apparatus for determination of a ground fault. The invention also relates to a power distribution network and an associated method.

SUMMARY

According to a first aspect of the invention an apparatus for determining a phase associated with a ground fault on a multi-phase power distribution network is provided, the apparatus configured to, based on determination of a spike fault, determine which of a plurality of RMS values of phase-to-phase fault currents is the minimum, said minimum RMS value indicative of a particular phase of the multi-phase power distribution network associated with the ground fault;

a. wherein the apparatus is configured to determine the occurrence of the spike fault based on a plurality of sample sets obtained at a predetermined sample rate and a residual current value, $i_R$, the sample sets comprising, at a particular sample time, the phase current of each phase of the multi-phase power distribution network and the residual current value, $i_R$, comprising a sum of said phase currents, said apparatus configured to determine an RMS value of the residual current, $I_R(n)$, as follows;

$$I_R(n) = \sqrt{\frac{1}{N}\sum_{k=n-N+1}^{n} |i_R(k)|^2}$$

b. where k is an index value of the sum, n designates a recent sample of a sliding window, and N is the sliding window size in terms of the number of samples, wherein the occurrence of the spike fault is determined based on at least $I_R(n)$ being above a predetermined residual current threshold ($IR_{set}$) for less than a predetermined spike time threshold ($IR_{time}$); and c. wherein the apparatus is configured to determine which of the plurality of RMS values of phase-to-phase fault currents $\Delta i_{xy}(n)$ is the minimum based on phase-to-phase currents $i_{xy}(n)$ comprising the difference between respective phase currents of the samples of each sample set, and the phase-to-phase fault currents $\Delta i_{xy}(n)$ comprising the difference between the phase-to-phase currents for each phase at the beginning and end of the sliding window, the apparatus configured to determine the RMS values of the phase-to-phase fault current $\Delta I_{xy}(n)$, as follows;

$$\Delta I_{xy}(n) = \sqrt{\frac{1}{N}\sum_{k=n-N+1}^{n} |\Delta i_{xy}(k)|^2}$$

where x and y designate the two phases used to determine each phase-to-phase current.

In one or more examples, the apparatus is configured for use with a three phase power distribution network comprising phases a, b and c and wherein the RMS values of the phase to phase fault currents that is the minimum is indicative of a particular phase of the multi-phase power distribution network on which a ground fault is present in that if the minimum $\Delta I_{min}$ comprises;

$\Delta I_{bc}$, then the ground fault is associated with phase a;
$\Delta I_{ca}$, then the ground fault is associated with phase b;
$\Delta I_{ab}$, then the ground fault is associated with phase c.

In one or more examples, the apparatus is configured to, in determination of the occurrence of the spike fault, determine a rate of change of the RMS value of the residual current and whether or not said rate of change is greater than a rate of change threshold;

a. the occurrence of the spike fault determined based on at least $I_R(n)$ being above the predetermined residual current threshold for less than the predetermined spike time threshold and the rate of change being greater than the rate of change threshold at least during part of the time $I_R(n)$ is greater than the predetermined residual current threshold.

In one or more examples, the apparatus is configured to determine whether the fault is of a forward fault direction;

a. based on the RMS values of the phase-to-phase fault current $\Delta I_{xy}(n)$ for each combination of phases and on an RMS value of the residual fault current $\Delta I_R(n)$, the residual fault current comprising the difference between the residual current derived from one of the sample sets at the beginning of the sliding window and derived from one of the sample sets at the end of the sliding window and said RMS value of the residual fault current $\Delta I_R(n)$ comprising;

$$\Delta I_R(n) = \sqrt{\frac{1}{N}\sum_{k=n-N+1}^{n} |\Delta i_R(k)|^2}$$

b. the apparatus configured to identify a minimum of the RMS values of the phase-to-phase fault current $\Delta I_{min}$ and a maximum of the RMS values of the phase-to-phase fault current $\Delta I_{max}$, the apparatus configured to determine a forward fault if;

c. $\Delta I_{min}$ is less than a first predetermined fraction of the RMS value of the residual fault current; and d. $\Delta I_{max}$ is greater than second predetermined fraction of the RMS value of the residual fault current.

In one or more examples, the first predetermined fraction is equal to or less than 0.2 or 0.15 or 0.1. In one or more examples, the first predetermined fraction is between 0.1 and 0.2 or 0.05 and 0.25. In one or more examples, the second predetermined fraction is equal to or greater than 0.8 or 0.85 or 0.9. In one or more examples, the second predetermined fraction is between 0.8 and 0.9 or 0.7 and 0.95.

In one or more examples, the apparatus is configured to raise a fault alarm based on the determination of a phase associated with a ground fault, the raising of a fault alarm dependent on;

a. the occurrence of the spike fault and the identification of a particular phase of the multi-phase power distribution network associated with the ground fault during said spike fault, at least a predetermined, alarm, number of times in a predetermined alarm period.

In one or more examples, the raising of the fault alarm is further dependent on the determination of a fault direction according to claim 3 for each occurrence of the spike fault.

In one or more examples, the sample rate of the sample sets is in the range of 2-3 kHz, such as 2400 Hz.

In one or more examples, the sliding window size corresponds to a single period of the fundamental frequency of the multi-phase distribution network. Thus, if the sampling rate is 2400 Hz and the fundamental frequency is 50 Hz, then N=2400/50=48 samples. Accordingly, the sliding window would encompass N consecutive samples from the most recently acquired sample.

In one or more examples, the predetermined residual current threshold is less than 10% or less than 5% of the rated current. The rated current may be the current applied to the multi-phase power distribution network, such as from a secondary side of a current transformer connected to the power distribution network.

In one or more examples, the predetermined residual current threshold may be less than 100 mA, or less than 50 mA.

In one or more examples, the predetermined spike time threshold is based on one cycle of the fundamental frequency of the multi-phase distribution network. Thus, for example, for a 50 Hz network, the spike time threshold may be 1/50*1000=20 ms or for a 60 Hz network, the spike time threshold may be 1/60*1000=16.67 ms.

According to a second aspect of the invention a power distribution network including the apparatus for determining a phase associated with a ground fault according to the first aspect is provided.

According to a third aspect of the invention a method for determining a phase associated with a ground fault on a multi-phase power distribution network is provided, the method comprising, based on determination of a spike fault, determining which of a plurality of RMS values of phase-to-phase fault currents is the minimum, said minimum RMS value indicative of a particular phase of the multi-phase power distribution network associated with the ground fault;

a. determining the occurrence of the spike fault based on a plurality of sample sets obtained at a predetermined sample rate and a residual current value, $i_R$, the sample sets comprising, at a particular sample time, the phase current of each phase of the multi-phase power distribution network and the residual current value, $i_R$, comprising a sum of said phase currents, said apparatus configured to determine an RMS value of the residual current, $I_R(n)$, as follows;

$$I_R(n) = \sqrt{\frac{1}{N} \sum_{k=n-N+1}^{n} |i_R(k)|^2}$$

where k is an index value of the sum, n designates a recent sample of a sliding window, and N is the sliding window size in terms of the number of samples, wherein the occurrence of the spike fault is determined based on at least $I_R(n)$ being above a predetermined residual current threshold ($IR_{set}$) for less than a predetermined spike time threshold ($IR_{time}$); and b. determining which of the plurality of RMS values of phase-to-phase fault currents $\Delta i_{xy}(n)$ is the minimum based on phase-to-phase currents $i_{xy}(n)$ comprising the difference between respective phase currents of the samples of each sample set, and the phase-to-phase fault currents $\Delta i_{xy}(n)$ comprising the difference between the phase-to-phase currents for each phase at the beginning and end of the sliding window, the apparatus configured to determine the RMS values of the phase-to-phase fault current $\Delta I_{xy}(n)$, as follows;

$$\Delta I_{xy}(n) = \sqrt{\frac{1}{N} \sum_{k=n-N+1}^{n} |\Delta i_{xy}(k)|^2}$$

where x and y designate the two phases used to determine each phase-to-phase current.

According to a fourth aspect a computer program or a computer program product comprising computer program code which, when executed on a processor having memory associated therewith is configured to perform the method of the third aspect is provided.

BRIEF DESCRIPTION OF THE DRAWINGS

There now follows, by way of example only, a detailed description of embodiments of the invention with reference to the following figures, in which.

DETAILED DESCRIPTION

Ground faults may occur in a power distribution network when one or more of the phases inadvertently connect to ground, such as due to damage to cabling that forms the network. The detection of ground faults in power distribution networks is difficult, particularly when the ground fault is intermittent. When the ground fault on an electrical cable of the power distribution network is at an initial stage, the electrical insulation may not be fully broken. This may result in an intermittent ground fault with an extra high fault impedance. This kind of fault is very hard to detect and it is especially difficult to determine the fault direction.

The apparatus and methods of the invention may advantageously provide for detection of ultra-high impedance ground faults that are in the above-described initial stage. The apparatus of the invention may also be advantageous in that determination of such a fault is based only on measurements of currents. As such, voltages measurements are not required (although may be used in some implementations). The apparatus may provide for, without any additional special hardware, fault direction detection and/or intermittent high impedance fault detection, which may be used to predict the future occurrence of a complete ground fault with high fault current. Thus, the apparatus may advantageously provide for fault direction detection using only measured currents and may provide for intermittent ultra-high impedance ground fault detection, as will be described below.

Figure 1:
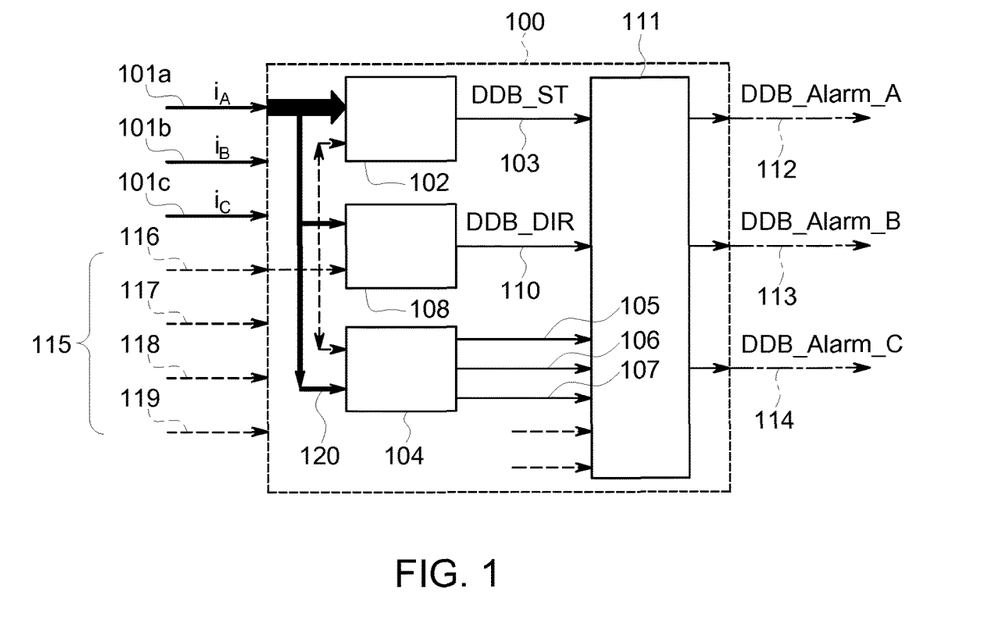
FIG. 1 shows an example apparatus for determining a phase associated with a ground fault on a multi-phase power distribution network.

FIG. 1 shows an apparatus 100 for determining a phase associated with a ground fault on a multi-phase power distribution networks. In particular, the apparatus 100 may be configured to determine a phase associated with a ground fault during an intermittent and/or transient electrical disturbance of current flow in the network, termed a fault spike. The apparatus is provided with input samples 101a, 101b, 101c of the current of each of the phases (A, B, C) of the multi-phase power distribution network. In this example, the multi-phase power distribution network is a three phase network and thus the apparatus is configured to operate with three phases. In other examples, a different number of phases may be used. In some examples, the apparatus 100 may be configured to measure the current of each of the phases to generate a set of current samples. However, in this example, a different apparatus (not shown) samples the current on each of the phases at a predetermined sampling rate and provides the apparatus with a stream of current samples comprising the sampled currents $i_A$, $i_B$, $i_C$ of each phase at each sampling time. In this example the sampling rate is 2400 Hz, although other sampling frequencies may be used such as between 2 and 3 kHz.

The apparatus 100 includes a spike fault element 102 for determining the occurrence of a spike fault based on a plurality of the sample sets, as will be described in more detail below. A spike fault flag signal 103 (termed DDB_ST) is generated by the spike fault element 102 on detection of a spike fault. The apparatus further comprises a faulty phase detection element 104 configured to determine which of a plurality of RMS values of phase-to-phase fault currents is the minimum, said minimum RMS value indicative of a particular phase of the multi-phase power distribution network associated with the ground fault (the operation of which will be discussed in more detail below). The faulty phase detection element 104 provides for generation of a phase indicator signal comprising one of a phase A fault signal 105 (termed DDB_FTA), phase B fault signal 106 (termed DDB_FTB) or phase C fault signal 107 (termed DDB_FTC) depending on which phase is determined to have the ground fault. The signal 103 and one of the signals 105-107 may provide for the ultimate output of the apparatus 100.

The apparatus 100, in this examples includes several optional components, which may increase its accuracy and/or functionality. In particular, the apparatus 100 includes a direction element 108 configured to determine the fault direction. A fault direction signal 110 (termed DDB_DIR) is provided by the direction element 108 indicative of the determined direction of the fault, which may be indicative of a forward fault direction. The apparatus 100 may also include an alarm element 111 for providing a fault alarm indication signal (collectively 112, 113, 114) to a further apparatus, which may provide for shutting down of the affected part of the power distribution network for repairs/inspection. The alarm element 105 may provide an indication of the phase to which the alarm relates as its fault alarm indication signal and may thus comprise any one of a phase A alarm 112 (termed DDB_Alarm_A), a phase B alarm 113 (termed DDB_Alarm_B) and a phase C alarm 114 (termed DDCB_Alarm_C).

The apparatus 100 is further shown as receiving a plurality of predetermined thresholds or settings at 115. The settings include a predetermined residual current threshold 116, a predetermined alarm time, $T_{set}$, 117, a predetermined, alarm, number of times $N_{set}$ 118, and CT ratio 119. The CT ratio may comprise the ratio of turns of a primary winding to a secondary winding of a current transformer connected to the power distribution network.

In general, the spike fault element 102 is configured to, based on current samples of each phase, discriminate between an intermittent/transient "spike" or a permanent ground fault. The spike fault element 102 uses a root mean squared (RMS) value of a plurality of residual current values covering a recent time window, each residual current value comprising the sum of the individual phase currents at a particular time, and comparison thereof with predetermined thresholds to determine the occurrence of a spike fault. In some examples a comparison of a derivative of the RMS value to a threshold is additionally used.

In general, the direction element 108 is configured to compare the magnitudes of RMS values derived from phase-to-phase current differences against thresholds to determine a fault direction.

In general, the faulty phase detection element 104 is configured to compare the magnitudes of RMS values derived from phase-to-phase fault currents to determine a minimum indicative of the faulty phase.

In general, the alarm element 111 is configured to count the number of the determined fault spikes, dependent on a faulty phase being identified at the time of the fault spike, over a predetermined sliding time window and raise an alarm if the count is greater than a predetermined threshold.

Figure 2:
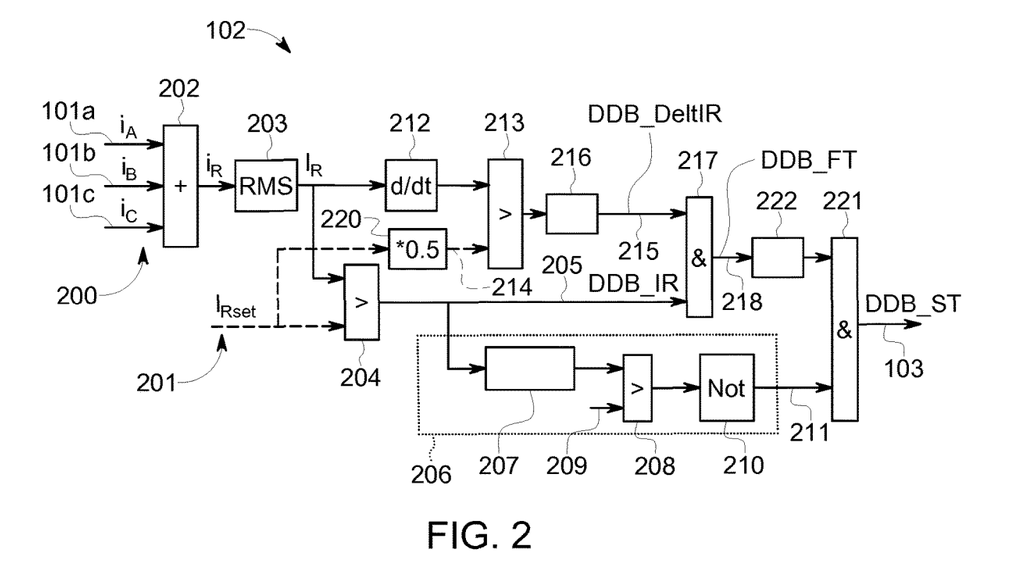
FIG. 2 shows an example spike fault element of the apparatus of FIG. 1.

FIG. 2 shows a more detailed view of the spike fault element 102. The spike fault element is configured to respond to the ultra-high impedance faults that may be indicative of an initial stage ground fault. The spike fault element 102 receives, at 200, the sample set of the current samples of each phase 101a, 101b, 101c. The spike fault element 102 is also shown receiving, at 201, a residual current threshold value $IR_{set}$, the use of which will be described below. It will be appreciated that the threshold value may be integrated with the logic (in hardware, software or firmware) of the element 102 or may be user-set or user adjustable.

The spike fault element 102 is configured to perform the following steps. The spike fault element is configured to determine, at block 202, a residual current value for each set of phase current samples. The residual current value $i_R$ is determined by the sum of the individual phase currents $i_A$, $i_B$, $i_C$ at a particular sample time (equation 1);

$$i_R = i_A + i_B + i_C \quad (1)$$

where, $i_R$ is residual current sample; $i_A$ is current sample of phase A; $i_B$ is current sample of phase B; and $i_C$ is current sample of phase C.

In other examples, the calculation of the residual current value is performed for a subset of the received phase current samples, e.g. at a lower rate than the sample rate of the current samples.

An RMS value of the residual current is then calculated, at block 203, using a plurality of residual current values determined over a recent period defined by a window size N extending from a current time. Equation 2 shows the calculation of the RMS value;

$$I_R(n) = \sqrt{\frac{1}{N} \sum_{k=n-N+1}^{n} |i_R(k)|^2} \quad (2)$$

where n is the most recent index and thus represents its associated value at a recent time, e.g. $I_R(n)$ may represent the residual current value derived from the most recent sample set at n; N is the sliding window size in terms of the number of samples used to form the RMS value i.e. corresponding to the number samples sets of phase currents, and k represents an index of the sum function.

The window size is, in this example, set to one cycle of fundamental frequency of the multi-phase power distribution network. For example, if the sampling rate of the phase currents is 2400 Hz and the fundamental frequency of the network is 50 Hz, then N=2400/50=48 samples.

Thus, each RMS value of equation 2 may have an overlap of N−1 samples with a subsequent RMS value in terms of the residual current values used. In other examples, the RMS values may be calculate with a different or no overlap.

The determination of the occurrence of a fault spike may be based on a number of parameters. In some examples, the magnitude of the RMS value may be compared to a threshold and the length of time the RMS value exceeds the threshold may be used to determine the occurrence of a fault spike. In this example a further optional parameter is used, namely a derivative of the RMS value, as will be described below.

Each RMS value $I_R(n)$ is compared to the predetermined residual current threshold ($I_{Rset}$) at block 204. If the value of $I_R(n)$ is greater than $I_{Rset}$ then a flag, DDB_IR is raised at 205. $I_R(n)$ being greater than $I_{Rset}$ may be indicative of an electrical disturbance and the raising of the flag provides an indication that this parameter is satisfied. The ultimate decision on whether a fault is present may require multiple parameters to be satisfied simultaneously.

The predetermined residual current threshold $I_{Rset}$ may be determined based on a rated current in a secondary winding of a current transformer connected to the power transmission network. Typically, the rated secondary current of a current transformer is 1A. For example, the predetermined residual current threshold $I_{Rset}$ may be less than 10% or less than 5% or about 0.05 of said rated "secondary" current. For example, if said rated current is 1A, then the threshold $I_{Rset}$ may be 50 mA (i.e. 5%).

Block 206 provides for determining the length of time that the $I_R(n)$ value is greater than $I_{Rset}$. Block 206 thus provides for discrimination between a transient spike and a permanent ground fault. In this example, block 206 acts on flag DDB_IR, although in other examples it may use the output of block 203, the threshold 201 and a timer. Block 206 thus measures the temporal width of the flag signal DDB_IR at block 207 and compares it, at block 208 to a predetermined spike time threshold ($IR_{time}$) 209. The predetermined spike time threshold, in this example, is set to one cycle of the fundamental frequency. Thus, if the temporal width of the DDB_IR flag is longer than $IR_{time}$=20 ms (for 50 Hz system) or for a 60 Hz system $IR_{time}$=1/60*1000=16.67 ms, then it indicates that the fault is not a spike fault.

The block 208 generates a "true" condition when the temporal width exceeds the $IR_{time}$ threshold and thus the block 206 includes a logic NOT block 210 such that a flag signal 211 is indicative of the DDB_IR flag persisting for less than the $IR_{time}$ threshold and thus comprising a "spike".

As mentioned above, a logic AND function based on the flag 205 and flag 211 may provide for generation of the spike fault flag Signal 103. However, this example shows the RMS values from block 203 provided to a derivative block 212, which may determine a derivative with respect to time of two or more RMS values, i.e. a rate of change of the RMS value of the residual current.

Block 213 compares the derivative of the RMS value to a rate of change threshold 214. If the derivative of the RMS value is greater than the rate of change threshold a flag DDB_deltaR 215 is raised. The flag 215 is provided to dwell for a dwell time, by block 216, on the condition of block 213 being satisfied. Thus, the flag 215 will be provided for the dwell time despite the condition at block 213 being satisfied for less than the dwell time. In this example, the dwell time is 10 ms. The dwell time may be related to the fundamental frequency, such as less than the fundamental frequency or less than or about 0.5*fundamental frequency.

The rate of change threshold, in this example, is based on the predetermined residual current threshold $I_{Rset}$, although in other embodiments it may be independent thereof. In particular, the rate of change threshold, in this example, comprises $0.5*I_{Rset}$. Block 220 provides for scaling adjustment of the $I_{Rset}$ value to form the rate of change threshold 214 used by the block 213.

The DDB_IR flag 205 is combined with the DDB_deltaR flag 215 by a logic AND block 217 to generate a DDB_FT flag signal 218.

A further logic AND block 221 is provided to combine the DDB_FT flag signal 218 and the flag signal 211 from the transient/permanent ground fault discrimination block 206 to provide the ultimate output of the element 102, spike fault flag signal DDB_ST 103. A delay block 222 may be used to delay the presentation of the DDB_FT flag signal 218 to the block 221 by a delay time. The delay time, in this example, comprises 20 ms, or some other value related to the fundamental frequency or less than the fundamental period.

It will be appreciated that other parameters may be used, which may generate respective flags, on which a presumption of the existence of a spike fault may be made by element 102.

Figure 3:
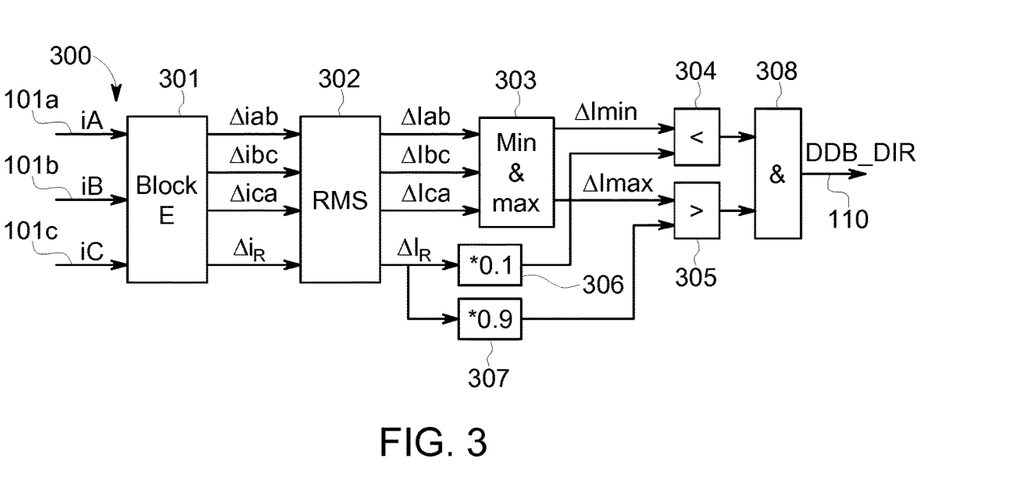
FIG. 3 shows an example fault direction element of the apparatus of FIG. 1.

FIG. 3 shows a more detailed view of the direction element 108. The direction element 108 is an optional component and is configured to determine the direction of the fault and, in particular, whether the fault is of a forward direction. It will be appreciated that a forward fault is a fault in the line protected by the apparatus where the protection device is located.

The fault direction element 108 receives, at 300, the sample set of the current samples of each phase 101a, 101b, 101c. A block 301 is configured to determine phase-to-phase currents $i_{xy}(n)$ comprising the difference between respective phase currents of the samples of each sample set and, subsequently, phase-to-phase fault currents $\Delta i_{xy}(n)$ comprising the difference between the phase-to-phase currents for each phase at the beginning and end of the sliding window.

Thus block 301 is configured to use equation 3 to determine the phase-to-phase currents $i_{xy}(n)$, as follow;

$$i_{ab}(n)=i_a(n)-i_b(n)$$

$$i_{bc}(n)=i_b(n)-i_c(n)$$

$$i_{ca}(n)=i_c(n)-i_a(n) \qquad (3)$$

Thus, the difference between the sampled phase currents in each sample set are determined by equation 3 which is then used to derive the phase-to-phase fault currents $\Delta i_{xy}(n)$. The phase-to-phase fault currents comprise the difference between one of the phase-to-phase currents at a first time and the same phase-to-phase current at a second time. The first and second times, in this example, comprise the beginning and end of the sliding window described above wherein the sliding window covers one cycle of rated frequency (in this example). Thus, the phase-to-phase fault currents are determined by equation 4;

$$\begin{cases} \Delta i_{ab}(n) = i_{ab}(n) - i_{ab}(n-N) \\ \Delta i_{bc}(n) = i_{bc}(n) - i_{bc}(n-N) \\ \Delta i_{ca}(n) = i_{ca}(n) - i_{ca}(n-N) \\ \Delta i_R(n) = i_R(n) - i_R(n-N) \end{cases} \qquad (4)$$

where n represents the associated term at the present time and N is the sliding window size. The sliding window size, as mentioned above may comprise one period of the fundamental frequency and thus N is number of samples per cycle of fundamental frequency. If the sampling rate of the phase current is 2400 Hz and the fundamental frequency is 50 Hz, N=2400/50=48.

Equation 4 additionally shows the determination of the residual fault current $\Delta i_R(n)$ from the different between the residual current at time n and the residual current at time n−N.

The apparatus is configured to determine, at block 302, the RMS values of the phase-to-phase fault current $\Delta I_{xy}(n)$, as follows by general equation 5;

$$\Delta I_{xy}(n) = \sqrt{\frac{1}{N} \sum_{k=n-N+1}^{n} |\Delta i_{xy}(k)|^2} \quad (5)$$

where x and y designate the two phases used to determine each phase-to-phase current.

Thus, in this three phase example, the RMS value of the three phase-to-phase fault currents together with RMS value of the residual fault current are calculated by more specific equations 6-9:

$$\Delta I_{ab}(n) = \sqrt{\frac{1}{N} \sum_{k=n-N+1}^{n} |\Delta i_{ab}(k)|^2} \quad (6)$$

$$\Delta I_{bc}(n) = \sqrt{\frac{1}{N} \sum_{k=n-N+1}^{n} |\Delta i_{bc}(k)|^2} \quad (7)$$

$$\Delta I_{ca}(n) = \sqrt{\frac{1}{N} \sum_{k=n-N+1}^{n} |\Delta i_{ca}(k)|^2} \quad (8)$$

$$\Delta I_R(n) = \sqrt{\frac{1}{N} \sum_{k=n-N+1}^{n} |\Delta i_R(k)|^2} \quad (9)$$

a.

Block 303 is configured to determine which of the RMS values of the three phase-to-phase fault currents determined by equations 6-9 is the minimum and which is the maximum. Accordingly, block 303 uses the equations 10 and 11 below;

$$\Delta I_{min} = \min\{\Delta I_{ab}, \Delta I_{bc}, \Delta I_{ca}\} \quad (10)$$

$$\Delta I_{max} = \max\{\Delta I_{ab}, \Delta I_{bc}, \Delta I_{ca}\} \quad (11)$$

The block 303 provides the values of the minimum and maximum for threshold comparison. The minimum RMS value $\Delta I_{min}$ is provided to comparison block 304. The maximum RMS value $\Delta I_{max}$ is provided to comparison block 305. The comparison blocks 304, 305 use thresholds based on the RMS value of the residual fault current. Block 306 determines a first predetermined fraction of the RMS value of the residual fault current and block 307 determines a second predetermined fraction of the RMS value of the residual fault current. In this example, the first predetermined fraction comprises 0.1 and the second predetermined fraction comprises 0.9. However it will be appreciated that other thresholds may be used to suit the characteristics of the network or the desired confidence of the determined direction.

A logic AND block 308 combines the output of the comparison blocks 304 and 305. Thus, the combination of the blocks 304-307 provide for determination of whether or not there is a forward fault by comparing the minimum RMS value of the RMS values of the three phase-to-phase fault component current with 0.1 times the RMS value of the residual fault current, and by comparing the maximum value with 0.9 times the RMS value of the residual fault current. That is, if $$\Delta I_{min} < 0.1 \Delta I_R \text{ AND } \Delta I_{max} > 0.9 \Delta I_R \quad (12)$$

then a forward fault is presumed and the fault direction flag signal 110 is raised to show a forward fault has been identified.

Thus, as described above, the block 108 is configured to determine whether the fault is of a forward fault direction based on the RMS values (calculated at block 302) of the phase-to-phase fault current $\Delta I_{xy}(n)$ (calculated at block 101) for each combination of phases and on an RMS value of the residual fault current $\Delta I_{xy}(n)$ (calculated at block 302), the residual fault current comprising the difference between the residual current of one of the sample sets at the beginning of the sliding window and one of the sample sets at the end of the sliding window (calculated at block 301). Further, the block 108 is configured to identify a minimum of the RMS values of the phase-to-phase fault current $\Delta I_{min}$ and a maximum of the RMS values of the phase-to-phase fault current $\Delta I_{max}$ at block 303 and determine a forward fault at blocks 304, 305 if;

$\Delta I_{min}$ is less than a first predetermined fraction of the RMS value of the residual fault current (calculated at block 304); and $\Delta I_{max}$ is greater than second predetermined fraction of the RMS value of the residual fault current (calculated at block 305).

Figure 4:
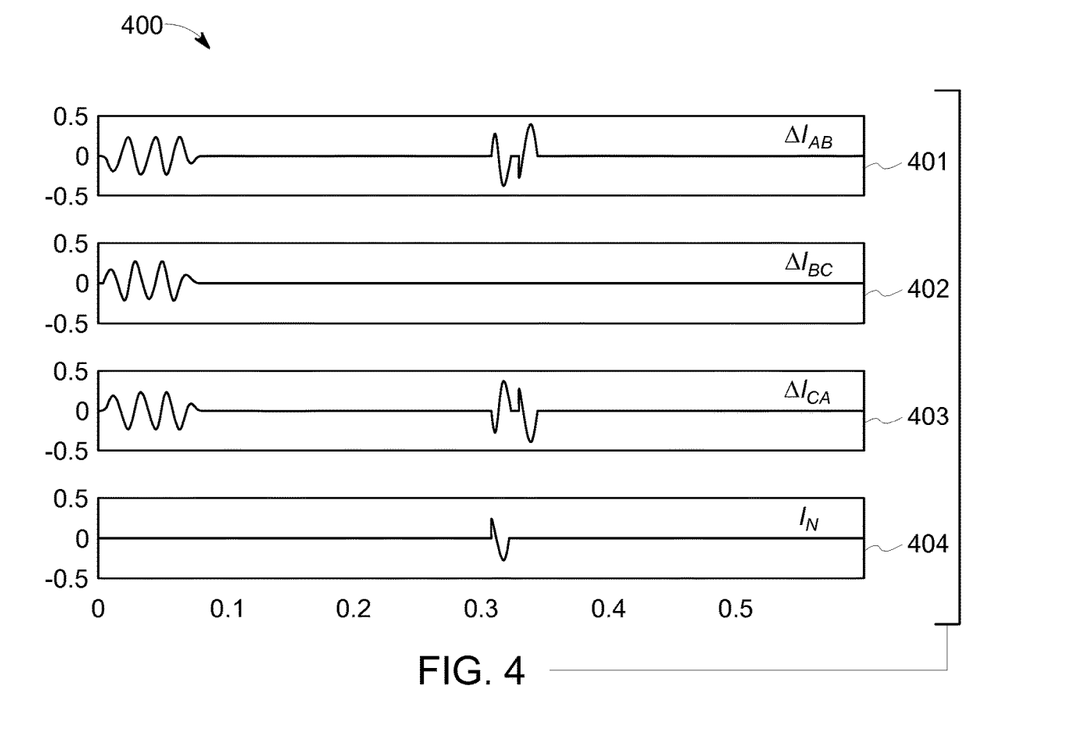
FIG. 4 shows an example trace of a parameter used by the apparatus during a phase to ground fault of forward direction.

FIG. 4 shows a shows an example trace 400 of the RMS value of the three phase-to-phase fault currents together with an RMS value of the residual fault current that are calculated by equations 6-9 during a phase to ground fault of forward direction. In particular, the trace of $\Delta I_{ab}(n)$ is shown at 401, $\Delta I_{bc}(n)$ is shown at 402, $\Delta I_{ca}(n)$ is shown at 403 and $I_R$ is shown at 404.

Figure 5:
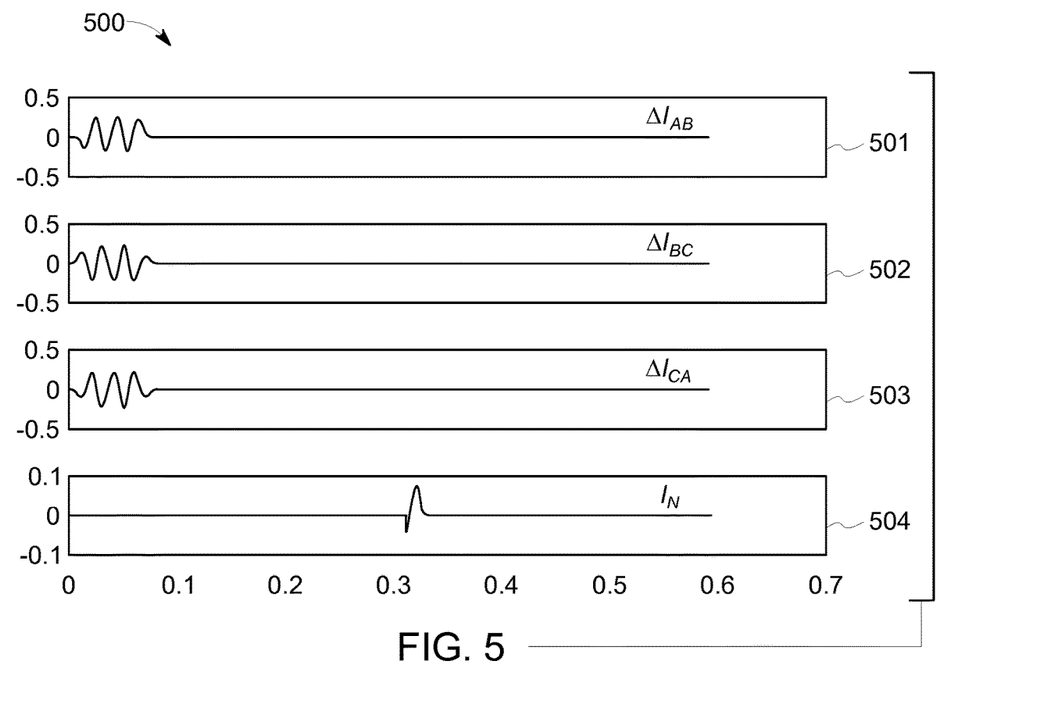
FIG. 5 shows an example trace of a parameter used by the apparatus during a phase to ground fault of backward direction.

FIG. 5 shows a shows an example trace 500 of the RMS value of the three phase-to-phase fault currents together with RMS value of the residual fault current that are calculated by equations 6-9 during a phase to ground fault of backward direction. In particular, the trace of $\Delta I_{ab}(n)$ is shown at 501, $\Delta I_{bc}(n)$ is shown at 502, $\Delta I_{ca}(n)$ is shown at 403 and $I_R$ is shown at 504.

Returning to FIG. 1, the faulty phase detection element 104 is configured to receive, at 120, the sample set of the current samples of each phase 101a, 101b, 101c. The faulty phase detection element 104 is configured to determine a minimum of RMS values of phase-to-phase fault currents, as determined by equations 3, 4 and 6 to 10. Accordingly, the faulty phase detection element 104 may be in communication with block 303 to receive the minimum RMS value. Alternatively, the element 104 may incorporate logic (software, hardware or firmware) similar to blocks 301, 302 and 303. It will be appreciated that a modified version of block 303 may be provided that determines only the minimum, by way of equation 10.

The faulty phase detection element 104 determines the phase associated with the ground fault from the minimum RMS value as follows;

If $\Delta I_{min} = \Delta I_{bc}$, then element 104 determines that the faulty phase is phase A and provides phase A fault signal 105.

If $\Delta I_{min}=\Delta I_{ca}$, then element 104 determines that the faulty phase is phase B, and provides phase B fault signal 106.

If $\Delta I_{min}=\Delta I_{ab}$, then element 104 determines that the faulty phase is phase C, and provides phase C fault signal 107.

In some examples, the output of the apparatus 100 may be a signal indicative of the phase that has ground fault based on the output 103 of the spike fault determination element 102 and the output 105, 106, 107 of the faulty phase detection element 104. Thus, output from the elements 102 and 104 at the same time may provide for output of the apparatus 100.

In this example, the apparatus includes the alarm element 111 which receives the output from the faulty phase detection element 104, spike fault element 102 and direction element 108 and provides for further processing thereof before raising an alarm. The alarm may comprise the output of the apparatus 100.

Figure 6:
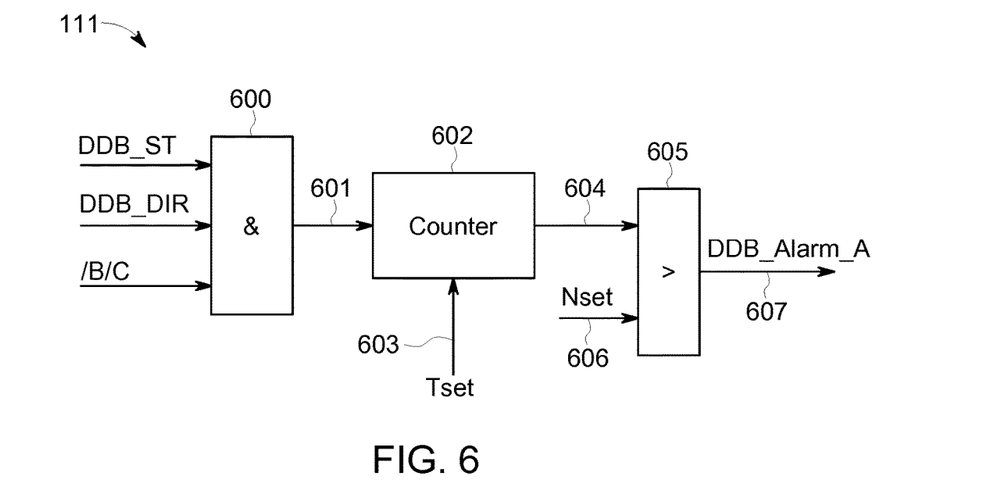
FIG. 6 shows an example alarm element of the apparatus of FIG. 1.

FIG. 6 shows a more detailed view of the alarm element 111. The element 111 is configured to receive the spike fault flag signal 103 (termed DDB_ST), the fault direction signal 110 (termed DDB_DIR) and one of the phase A fault signal 105 (termed DDB_FTA), the phase B fault signal 106 (termed DDB_FTB) or the phase C fault signal 107 (termed DDB_FTC) depending on which phase is determined to have the ground fault. Accordingly, there may be three arrangements as shown in FIG. 6, one for each phase and therefore each receiving one of the phase fault signals 105, 106, 107. The element 111 includes a logic AND block 600 for receiving flag signals described above. On the occurrence of simultaneous receipt of the DDB_ST, DDB_DIR and one of the DDB_FTx flag signals, the block 600 generate a fault flag signal 601.

In particular, the apparatus is configured to determine a forward direction spike fault of phase A when flag signals DDB_ST, DDB_DIR and DDB_FTA are received by the block 600. The apparatus is configured to determine a forward direction spike fault of phase B when flag signals DDB_ST, DDB_DIR and DDB_FTB are received by the block 600. Finally, the apparatus is configured to determine a forward direction spike fault of phase C when flag signals DDB_ST, DDB_DIR and DDB_FTC are received by the block 600. These forward direction spike fault signals for each phase may form the output of the apparatus 100.

However, in the present example, an alarm signal is not generated until a predetermined number of fault flag signals are received within a predetermined recent amount of time. A counter block 602 is configured to count the number of fault flag signals 601 received within a recent time period defined by a predetermined alarm period, $T_{set}$, shown at 603. The output 604 of the counter thus comprises an integer of the number of tithes the fault flag signal is generated in a sliding time window. A comparison block 605 compares the output 604 with a predetermined "alarm" number of times, $N_{set}$, shown at 606. If the output 604 exceeds the $N_{set}$ threshold then an alarm signal 607 is generated. Given that the arrangement of FIG. 6 is provided for each of the phase fault signals, the alarm signal 607 is also indicative of the phase on which the alarm is generated.

The predetermined values $N_{set}$ and $T_{set}$, received by the apparatus 100 at 117 and 118, may be user defined.

The functionality of the components discussed above in relation to FIGS. 1-3 and 6 may be provided in hardware, software or firmware.

Figure 7:
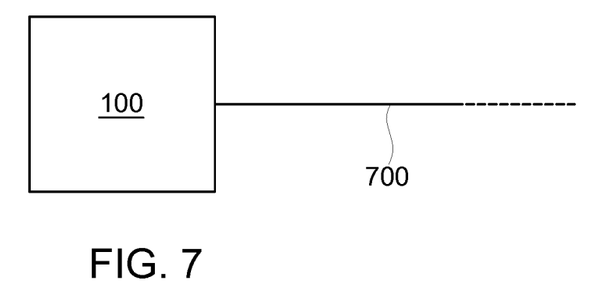
FIG. 7 shows a power distribution network with the apparatus for determining a phase associated with a ground fault on a multi-phase power distribution network connected thereto.

FIG. 7 shows a multi-phase power distribution network 700 having the apparatus 100 connected thereto, such as via a phase current sampling device (not shown). The apparatus 100 may further be connected to or form part of a fault monitoring apparatus and/or fault action response apparatus for providing for repair/inspection of the network 700. The multi-phase power distribution network 700 may include only one power source.

Figure 8:
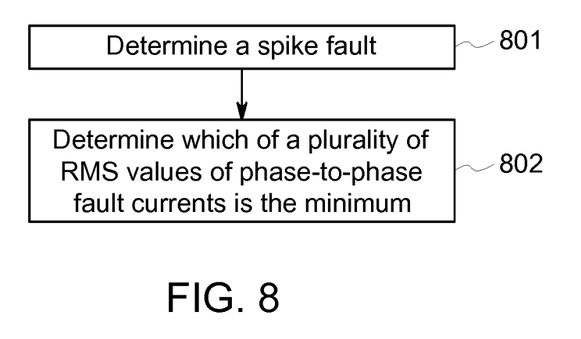
FIG. 8 shows a flow chart illustrating an example method.

FIG. 8 shows a flowchart showing the steps of; based on determination of a spike fault 801, determine which of a plurality of RMS values of phase-to-phase fault currents is the minimum 802, said minimum RMS value indicative of a particular phase of the multi-phase power distribution network associated with the ground fault.

What we claim is:

1. An apparatus configured to determine a phase associated with a ground fault on a multi-phase power distribution network, the apparatus configured to, based on determination of a spike fault, determine which of a plurality of RMS values of phase-to-phase fault currents is the minimum, said minimum RMS value indicative of a particular phase of the multi-phase power distribution network associated with the ground fault;

wherein the apparatus is configured to determine the occurrence of the spike fault based on a plurality of sample sets obtained at a predetermined sample rate and a residual current value, $i_R$, the sample sets comprising, at a particular sample time, the phase current of each phase of the multi-phase power distribution network and the residual current value, $i_R$, comprising a sum of said phase currents, said apparatus configured to determine an RMS value of the residual current, $I_R(n)$, as follows;

$$I_R(n) = \sqrt{\frac{1}{N}\sum_{k=n-N+1}^{n}|i_R(k)|^2}$$

where k is an index value of the sum, n designates a recent sample of a sliding window, and N is the sliding window size in terms of the number of samples, wherein the occurrence of the spike fault is determined based on at least $I_R(n)$ being above a predetermined residual current threshold ($IR_{set}$) for less than a predetermined spike time threshold ($IR_{time}$); and wherein the apparatus is configured to determine which of the plurality of RMS values of phase-to-phase fault currents $\Delta i_{xy}(n)$ is the minimum based on phase-to-phase currents $i_{xy}(n)$ comprising the difference between respective phase currents of the samples of each sample set, and the phase-to-phase fault currents $\Delta i_{xy}(n)$ comprising the difference between the phase-to-phase currents for each phase at the beginning and end of the sliding window, the apparatus configured to determine the RMS values of the phase-to-phase fault current $\Delta I_{xy}(n)$, as follows;

$$\Delta I_{xy}(n) = \sqrt{\frac{1}{N}\sum_{k=n-N+1}^{n}|\Delta i_{xy}(k)|^2}$$

where x and y designate the two phases used to determine each phase-to-phase current.

2. The apparatus of claim 1, wherein the apparatus is configured for use with a three phase power distribution network comprising phases a, b and c and wherein the RMS values of the phase to phase fault currents that is the minimum is indicative of a particular phase of the multi-phase power distribution network on which a ground fault is present in that if the minimum $\Delta I_{min}$ comprises;
  i. $\Delta I_{bc}$, then the ground fault is associated with phase a;
  ii. $\Delta I_{ca}$, then the ground fault is associated with phase b;
  iii. $\Delta I_{ab}$, then the ground fault is associated with phase c.

3. The apparatus of claim 1, wherein the apparatus is configured to, in determination of the occurrence of the spike fault, determine a rate of change of the RMS value of the residual current and whether or not said rate of change is greater than a rate of change threshold;
  the occurrence of the spike fault determined based on at least $I_R(n)$ being above the predetermined residual current threshold for less than the predetermined spike time threshold and the rate of change being greater than the rate of change threshold at least during part of the time $I_R(n)$ is greater than the predetermined residual current threshold.

4. The apparatus of claim 3, wherein the apparatus is configured to raise a fault alarm based on the determination of a phase associated with a ground fault, the raising of a fault alarm dependent on;
  the occurrence of the spike fault and the identification of a particular phase of the multi-phase power distribution network associated with the ground fault during said spike fault, at least a predetermined, alarm, number of times in a predetermined alarm period.

5. The apparatus of claim 4, wherein the raising of the fault alarm is further dependent on the determination of a fault direction for each occurrence of the spike fault.

6. The apparatus of claim 1, wherein the apparatus is configured to determine whether the fault is of a forward fault direction;
  based on the RMS values of the phase-to-phase fault current $\Delta I_{xy}(n)$ for each combination of phases and on an RMS value of the residual fault current $\Delta I_R(n)$, the residual fault current comprising the difference between the residual current derived from one of the sample sets at the beginning of the sliding window and derived from one of the sample sets at the end of the sliding window and said RMS value of the residual fault current $\Delta I_R(n)$ comprising;

$$\Delta I_R(n) = \sqrt{\frac{1}{N} \sum_{k=n-N+1}^{n} |\Delta i_R(k)|^2}$$

the apparatus configured to identify a minimum of the RMS values of the phase-to-phase fault current $\Delta I_{min}$ and a maximum of the RMS values of the phase-to-phase fault current $\Delta I_{max}$, the apparatus configured to determine a forward fault if;
  $\Delta I_{min}$ is less than a first predetermined fraction of the RMS value of the residual fault current; and
  $\Delta I_{max}$ is greater than second predetermined fraction of the RMS value of the residual fault current.

7. The apparatus of claim 6, wherein
  the first predetermined fraction is between 0.1 and 0.2; and/or
  the second predetermined fraction is between 0.8 and 0.9.

8. The apparatus of claim 1, wherein the sample rate of the sample sets is in the range of 2-3 kHz.

9. The apparatus of claim 1, wherein the sliding window size corresponds to a single period of the fundamental frequency of the multi-phase distribution network.

10. The apparatus of claim 1, wherein the predetermined residual current threshold (116) is less than 10% of the rated current applied to the power distribution network.

11. The apparatus of claim 1, wherein the predetermined residual current threshold (116) may be less than 100 mA.

12. The apparatus of claim 1, wherein the predetermined spike time threshold is based on one cycle of the fundamental frequency of the multi-phase distribution network.

13. The apparatus of claim 1, wherein the sliding window extends from a present time and a time one cycle of rated frequency prior thereto.

14. A multi-phase power distribution network including the apparatus for determining a phase associated with a ground fault according to claim 1.

15. A method for determining a phase associated with a ground fault on a multi-phase power distribution network, the method comprising, based on determination of a spike fault, determining which of a plurality of RMS values of phase-to-phase fault currents is the minimum, said minimum RMS value indicative of a particular phase of the multi-phase power distribution network associated with the ground fault;
  determining the occurrence of the spike fault based on a plurality of sample sets obtained at a predetermined sample rate and a residual current value, $i_R$, the sample sets comprising, at a particular sample time, the phase current of each phase of the multi-phase power distribution network and the residual current value, $i_R$, comprising a sum of said phase currents, said apparatus configured to determine an RMS value of the residual current, $I_R(n)$, as follows;

$$I_R(n) = \sqrt{\frac{1}{N} \sum_{k=n-N+1}^{n} |i_R(k)|^2}$$

where k is an index value of the sum, n designates a recent sample of a sliding window, and N is the sliding window size in terms of the number of samples, wherein the occurrence of the spike fault is determined based on at least $I_R(n)$ being above a predetermined residual current threshold ($IR_{set}$) for less than a predetermined spike time threshold ($IR_{time}$); and
  determining which of the plurality of RMS values of phase-to-phase fault currents $\Delta i_{xy}(n)$ is the minimum based on phase-to-phase currents $i_{xy}(n)$ comprising the difference between respective phase currents of the samples of each sample set, and the phase-to-phase fault currents $\Delta I_{xy}(n)$ comprising the difference between the phase-to-phase currents for each phase at the beginning and end of the sliding window, the apparatus configured to determine the RMS values of the phase-to-phase fault current $\Delta I_{xy}(n)$, as follows;

$$\Delta I_{xy}(n) = \sqrt{\frac{1}{N} \sum_{k=n-N+1}^{n} |\Delta i_{xy}(k)|^2}$$

where x and y designate the two phases used to determine each phase-to-phase current.

\* \* \* \* \*